United States Patent

Tempel

[15] 3,678,402

[45] July 18, 1972

[54] STABILIZED DIRECT COUPLED AMPLIFIER HAVING IMPROVED FREQUENCY RESPONSE AND MINIMUM INTERMODULATION DISTORTION

[72] Inventor: George F. Tempel, Neptune, N.J.

[73] Assignee: Electronic Associates Inc., Long Branch, N.J.

[22] Filed: March 13, 1968

[21] Appl. No.: 717,484

[52] U.S. Cl. .....330/9, 330/35, 330/24, 330/17, 330/207 P

[51] Int. Cl. .....H03f 1/02

[58] Field of Search .....330/9, 38 FE, 3, 10 C

[56] References Cited

UNITED STATES PATENTS

| | | | |
|---|---|---|---|
| 3,218,566 | 11/1965 | Hayes, Jr. | 330/9 |
| 3,411,097 | 11/1968 | Hinrichs | 330/9 |
| 3,422,336 | 1/1969 | Hollstein, Jr. | 330/9 |

*Primary Examiner*—Nathan Kaufman
*Attorney*—Edward A. Petko and Robert M. Skolnik

[57] ABSTRACT

Improved frequency response, lower distortion factors and rapid overload recovery are obtained in a stabilized operational amplifier by eliminating the blocking capacitor at the input to the circuit from the summing junction. This is accomplished by having an insulated gate field effect transistor connected between the summing junction of the amplifier and the first input stage; or, by utilizing insulated gate field effect transistor circuitry as the first amplifier stage.

1 Claim, 9 Drawing Figures

INVENTOR.
GEORGE F. TEMPEL
BY Robert M. Skolnik

STABILIZED DIRECT COUPLED AMPLIFIER HAVING IMPROVED FREQUENCY RESPONSE AND MINIMUM INTERMODULATION DISTORTION

This invention relates to a stabilized direct coupled amplifier of the type used for analog computation and more particularly to such an amplifier having an improved frequency response with a minimum of intermodulation distortion and an improved reduction of bias and leakage currents, with rapid recovery from over loads without the necessity of feedback limiters or other circuitry.

It has become the practice in the analog computer art to employ operational amplifiers in almost all types of analog computing elements. Such operational amplifiers are of the direct coupled type operating in conjunction with a stabilizing modulated carrier-type amplifier to provide freedom from drift with superior high-frequency response. To eliminate extraneous currents, such as grid currents if vacuum tubes are employed in the amplifier, or base currents for solid state amplifiers, prior art operational amplifiers have employed a capacitor between the summing junction and the input stage of the direct-coupled amplifier. However, during an overload condition, an abnormally high signal voltage would be applied to the input circuit of the amplifier which charges the blocking capacitor to such a degree that, when the overload condition has ceased, the charge on the capacitor continues to bias the input stage of the amplifier out of its normal operating range. The amplifier remains disabled until the capacitor has been discharged.

A particular means for overcoming such undesirable effects is taught in the patent of Monroe A. Miller, U.S. Pat. No. 3,081,435 issued Mar. 12, 1963 which patent is assigned to the assignee of the present application. As disclosed in that patent, limiting means are provided at the summing junction of the amplifier which means are in the form of oppositely connected silicon junction diodes that generally do not interfere with normal operation of the amplifier and yet prevent the capacitor from being unduly charged by an overload signal and allow the capacitor to be automatically discharged within a relatively short time, several seconds, which is a great improvement over the thirty to sixty second or longer periods encountered when such limiting means are not employed.

Also, such blocking capacitors provide other undesirable effects which are detrimental to the over-all performance of the amplifier since the capacitor is a reactive device and adds an undesired pole to the frequency response of the amplifier.

An additional problem in operational amplifiers which employ a bipolar chopper transistor as a modulating element is that there results a voltage offset as well as standard current leakage problems which are present with junction type transistors.

It is, then, an object of the present invention to provide a stabilized direct coupled amplifier having an improved frequency response.

It is another object of the present invention to provide an improved stabilized direct coupled amplifier in which unwanted input currents have been eliminated.

It is still another object of the present invention to provide a stabilized direct coupled amplifier which is not disabled by overload conditions.

While input capacitors have undesirable effects on the operation of direct coupled amplifiers, such capacitors are used to couple the summing junction to the main amplifier to eliminate the effect of bias and leakage currents. Thus, in order to eliminate the need for such a capacitor, means are required to otherwise eliminate or block such currents.

In recent years, a particular type of amplifying element has been developed in the art which is commonly referred to as an insulated gate field effect transistor which is a solid state device in which carrier action is modulated by an imposed field rather than by imposed current. Such field effect transistors require no input gate current and are characterized by the lack of such currents. Such insulated gate devices are discussed in an article by Lancaster, in Electronics World, July, 1966, beginning at page 34.

A feature of the present invention resides in a high gain operational amplifier including a direct coupled amplifier having an insulated gate field effect transistor connected between the summing junction of the amplifier and the first input stage of an amplifier.

In addition, the stabilizer amplifier for the direct coupled amplifier may be provided with an insulated gate field effect transistor as a required modulating element in place of prior art bipolar chopper transistors.

These and other objects, advantages and features of the present invention will become more readily apparent from a review of the following specification when read in conjunction with the drawings wherein.

Figure 4:
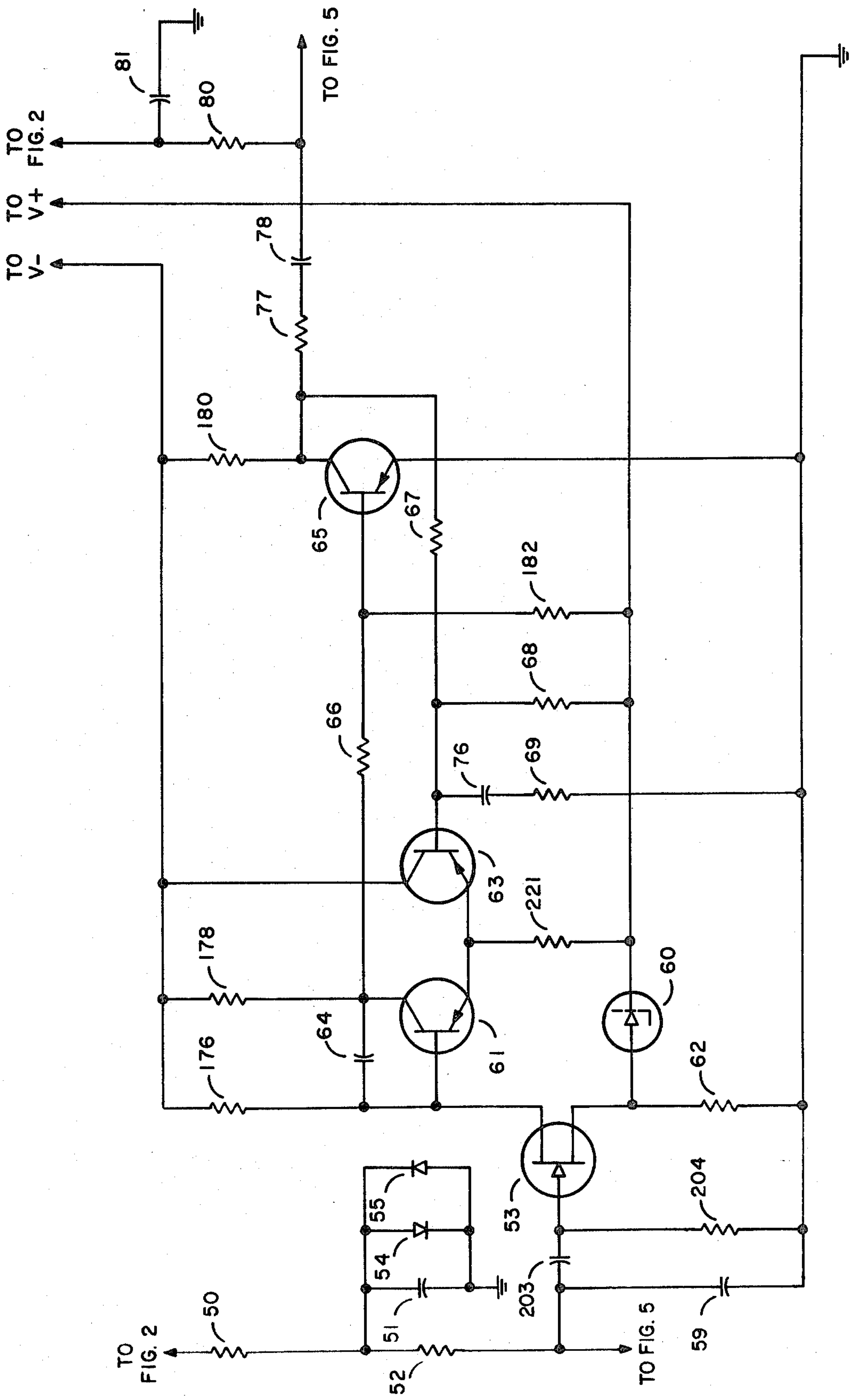
FIG. 4 is a schematic diagram of the stabilizing amplifier employed with the present invention.
Figure 5A:
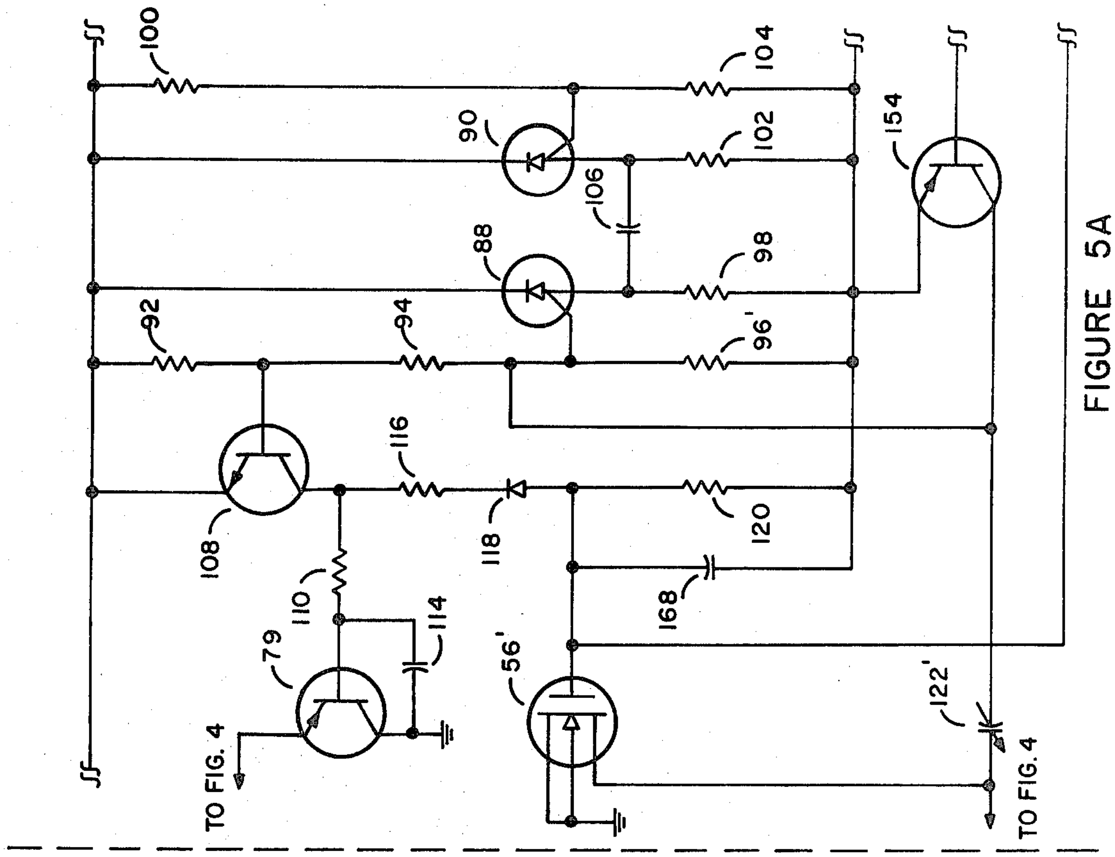
Figure 6:
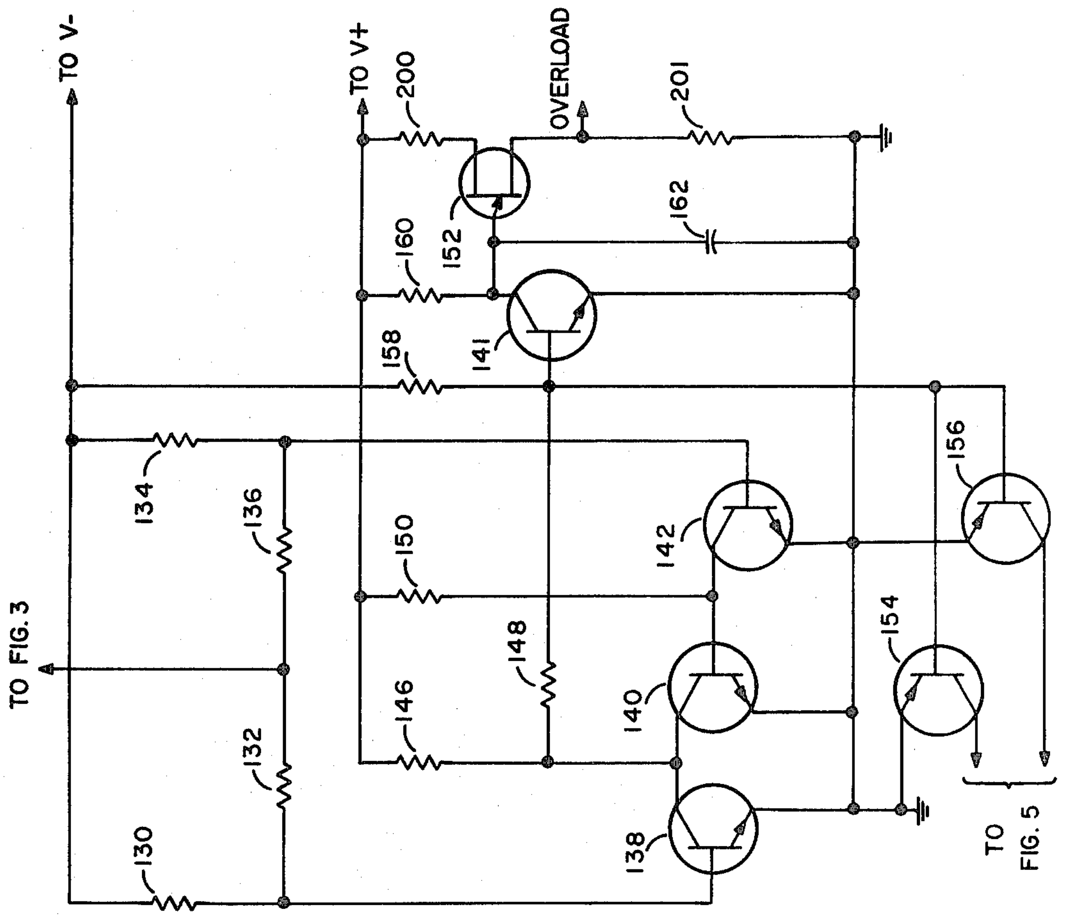
Figure 5:
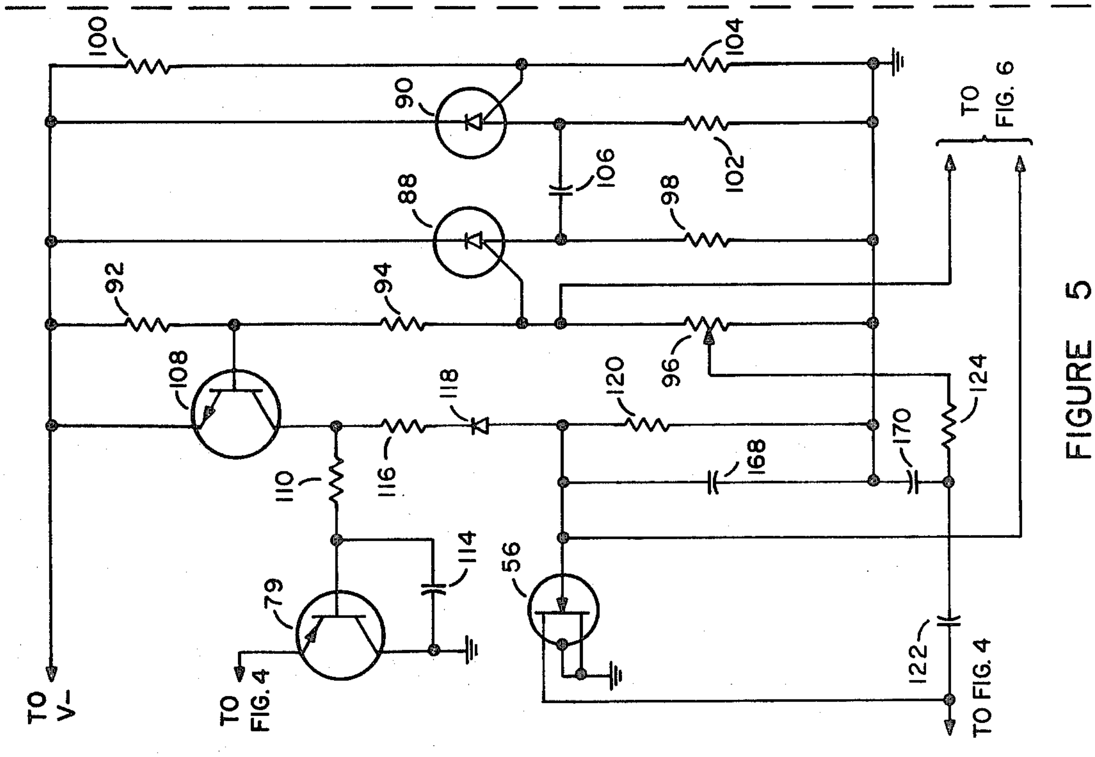
Figure 7:
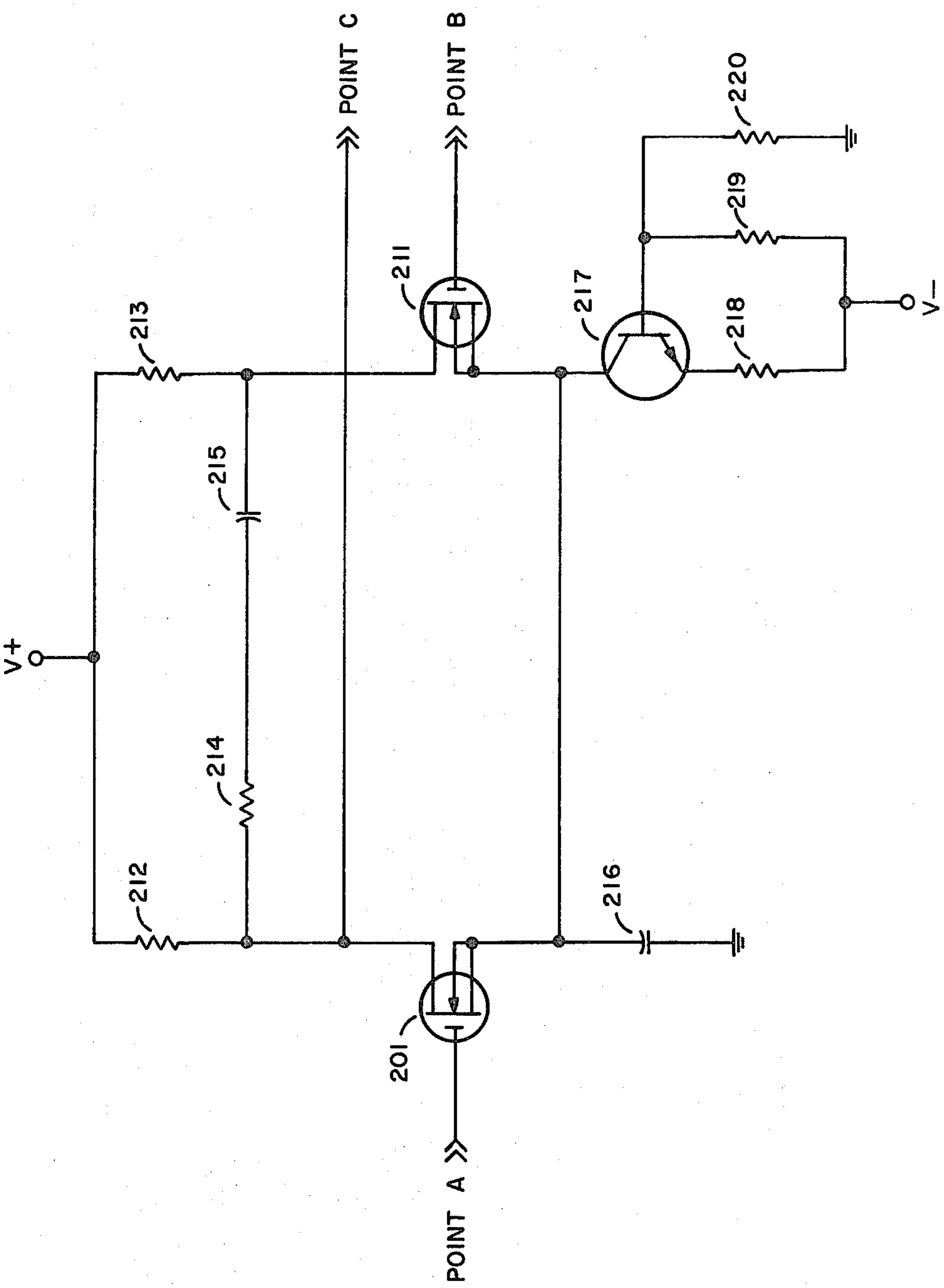

FIG. 4 A is a schematic diagram of a modification of the stabilizing amplifier usable in the present invention;

FIG. 5 is a schematic diagram of the oscillator, chopper and demodulate employed with the present invention;

FIG. 5 A is a schematic diagram of a modified oscillator, chopper and demodulator usable in the present invention;

FIG. 6 is a schematic diagram of the overload circuitry employed with the present invention; and FIG. 7 is a schematic diagram of a modified first stage of amplification usable in the present invention.

In brief, the invention comprises a stabilized direct coupled operational amplifier employing an insulated gate field effect transistor between the summing junction and the input amplifier stage. Because the insulated gate field effect transistor draws no gate current, the need for blocking capacitance at the input is eliminated. Recovery from overload is virtually immediate because no charge can be stored at the input to the amplifier stages. In addition, the insulated gate field effect transistor may itself be connected so as to constitute the input stage of amplification.

Figure 1:
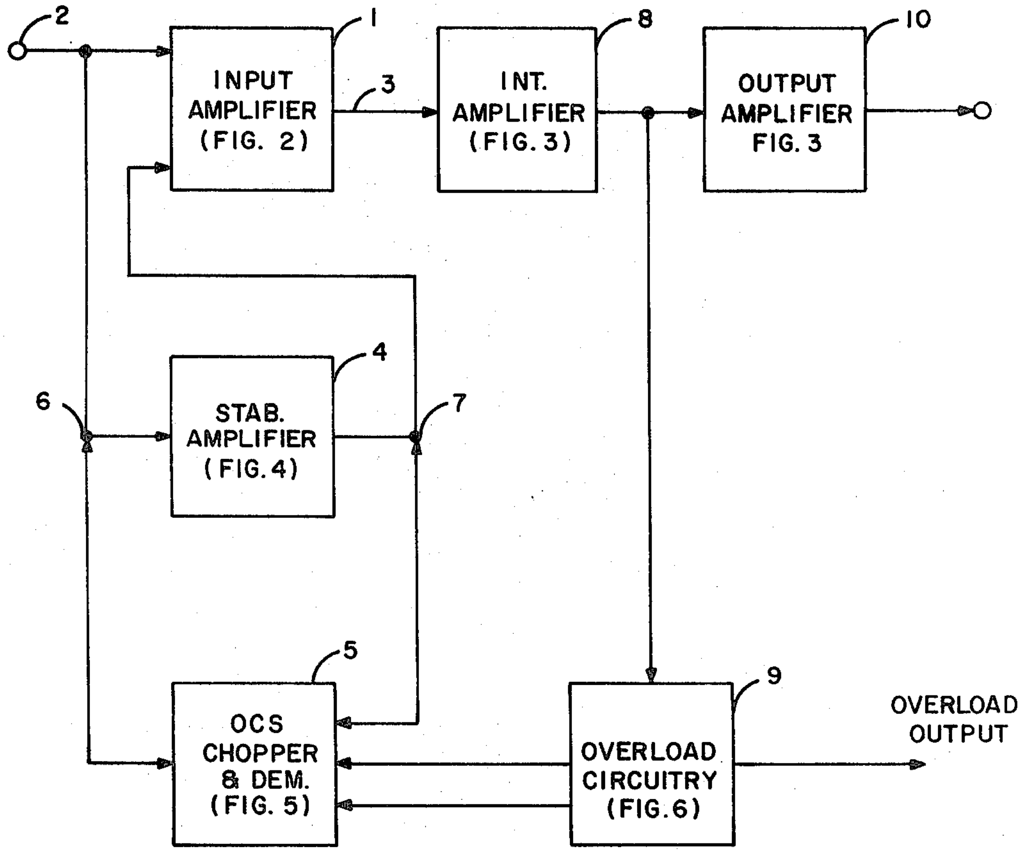
FIG. 1 is a block diagram of the stabilized direct coupled operational amplifier according to the present invention.

As illustrated in FIG. 1, the high gain operational amplifier of the present invention is formed of a main direct coupled input amplifier 1 having input terminal 2 and output terminal 3. The input signal at terminal 2 is also supplied as an input to stabilizer amplifier 4. This signal is modulated by the chopper circuitry in block 5 for presentation back to stabilizer amplifier 4 at junction 6. The modulated signal at the output of the stabilizer amplifier is demodulated by the demodulator circuitry in block 5 for presentation back to junction 7, at the output of stabilizer amplifier 4. The signal at junction 7 is coupled back to the direct coupled input amplifier 1 thereby providing compensation for the effects of drift due to variation in circuit component parameters caused by temperature change, aging, and the like. The output signal at terminal 3 is fed to a next stage 8 for further amplification. This stage provides the sense point for overload in the amplifier system and is coupled to overload circuitry 9. The output signal from stage 8 is also fed to output circuitry 10 for final amplification.

Figure 2:
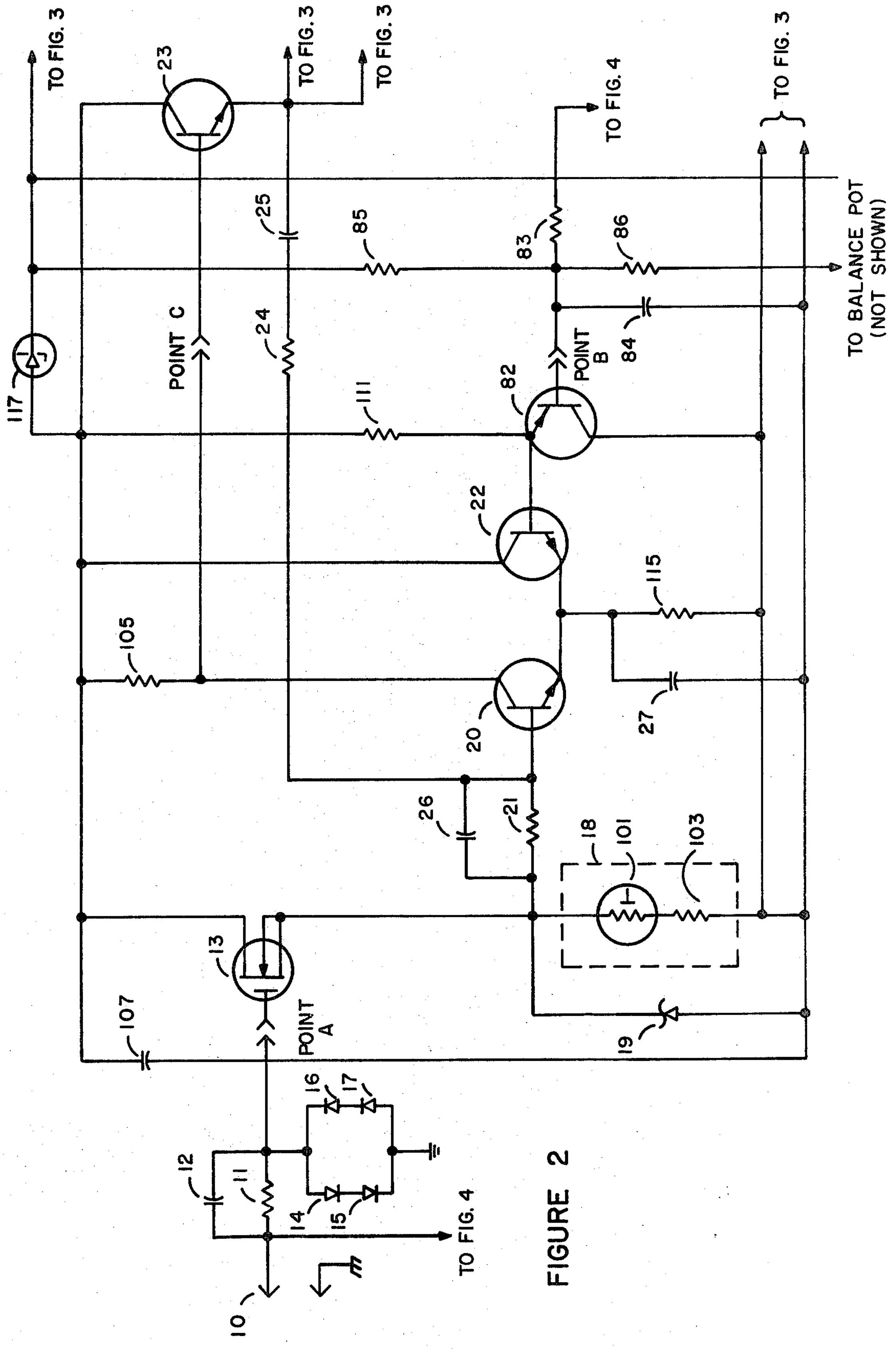
FIG. 2 is a schematic diagram of the main direct coupled input amplifier as employed with the present invention.

While prior art operational amplifiers employed a blocking capacitor between the summing junction and the direct coupled amplifier, the present invention eliminates the need for such capacitor. As illustrated in FIG. 2, the signal from the summing junction 10 is supplied by way of resistor 11 to the gate of an insulated gate field effect transistor 13 which is connected in a source following configuration. Capacitor 12 is coupled in parallel with resistor 11 to provide high frequency compensation for the input capacitance of field effect transistor 13, Diodes 14, 15, 16 and 17 are coupled in tandem oppositely poled arrangement between gate of transistor 13 and ground to perform a clamping action to prevent damage to transistor 13 under overload conditions. Resistor 18 comprised of thermistor 101 and fixed resistance 103 provides the source resistance for field effect transistor 13 as well as temperature compensation for the stage. Stabistor 19 protects the source from high voltage transients under turn-on or overload conditions.

The signal provided at the source of transistor 13 is direct coupled to the base of transistor 20 by way of resistance 21. Transistors 20 and 22 comprise the first voltage gain stage of the main amplifier and are connected in a differential configuration. The signal at the collector of transistor 20 is direct coupled to the base of emitter follower transistor 23. The signal at the emitter of transistor 23 constitutes the output of the first voltage gain stage. Resistor 24 and capacitor 25 are coupled in series between the emitter of transistor 23 and base of transistor 20, FIG. 2, to provide negative feedback therebetween and determine, in conjunction with resistor 21, the frequency response of this first voltage gain stage. Capacitor 26 coupled in parallel with resistor 21, and capacitor 27 connected between the common junction of differential configuration 20, 22 and ground, provide high frequency compensation for this first voltage gain stage.

Resistor 105 is the collector load for transistor 20 while resistor 111 is the bias resistor for transistor 22. Resistor 115 is connected between the common emitter junction of transistors 20, 22 and a source of negative voltage.

Figure 3:
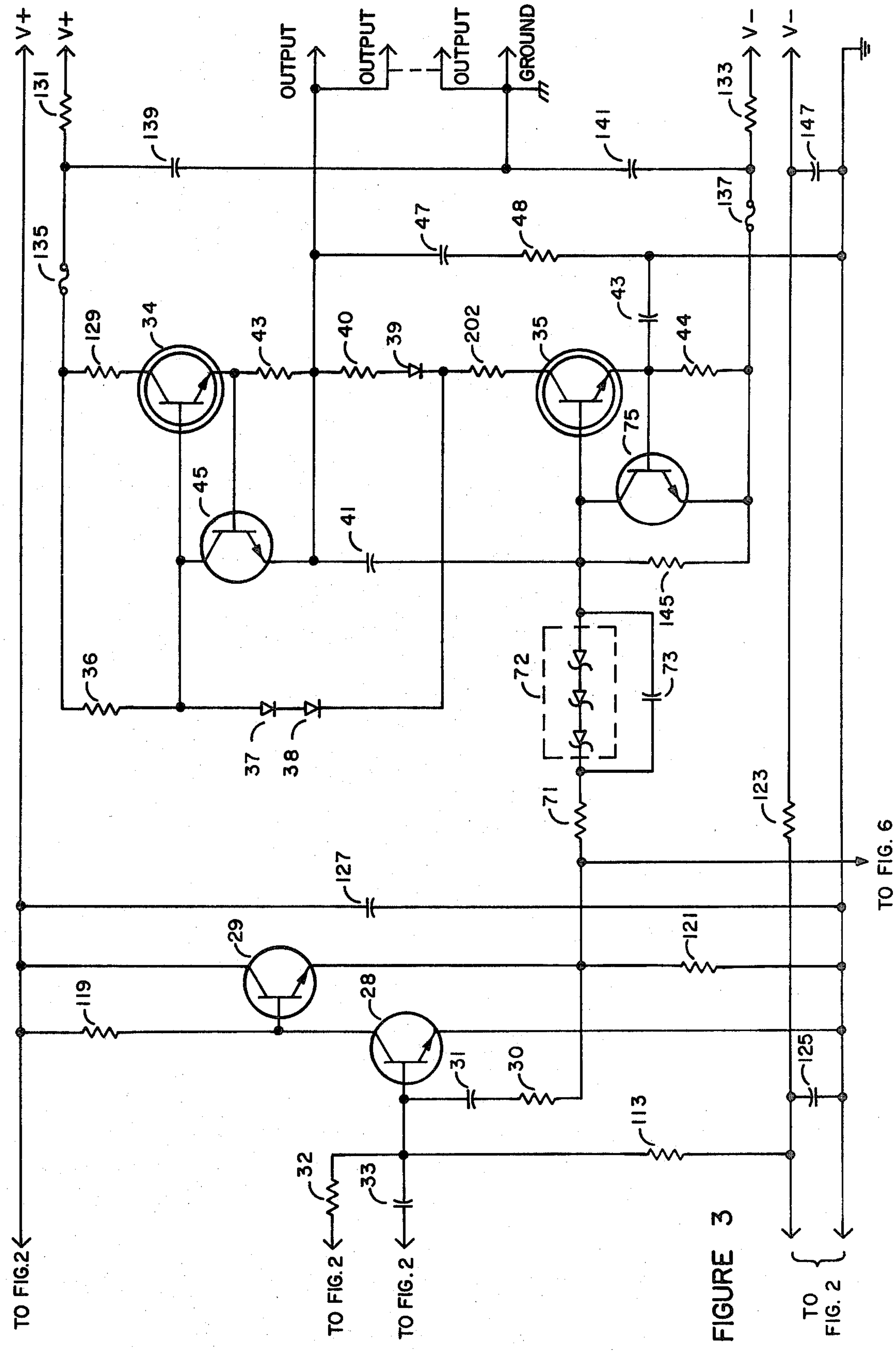
FIG. 3 is a schematic diagram of the intermediate amplifier stage and the output circuitry employed with the present invention.

The emitter of transistor 23 is direct coupled to the base of transistor 28, FIG. 3, by way of resistor 32. In FIG. 3, transistor 28 forms the second voltage gain stage of the main amplifier and the signal at its collector is direct coupled to emitter follower transistor 29. Resistor 30 and capacitor 31 are connected in series between the emitter of transistor 29 and the base of transistor 28 to provide negative feedback and, in conjunction with resistor 32, to determine the frequency response for the second gain stage. Capacitor 33 provides high frequency compensation for this second stage. Resistor 119 constitutes the collector load for transistor 28.

The base of transistor 28 is coupled to a source of negative voltage through bias resistor 113. The emitter of transistor 29 is grounded through emitter resistor 121.

The emitter of transistor 29 is direct coupled by way of resistor 71 and Zener diode 72 to the input of the final output stage. Capacitor 73 reduces the high frequency noise in the Zener diode 72.

Transistors 34 and 35 are connected in a totem pole arrangement to form the output stage and constitute the third voltage gain stage of the amplifier. The collector load of transistor 35 consists of resistors 36 and 202. Bias is provided by diodes 37 and 38. Resistor 202 serves to suppress surge currents at the collector of transistor 35, while resistor 129 serves to suppress surge currents at the collector of transistor 34. Diode 39 and resistor 40 couple the signal of the collector of transistor 35 to the output terminal for negative output voltage swings. Capacitor 41, connected as a negative feedback element from the output terminal to the base of transistor 35, together with resistor 71 determine the frequency response for this third voltage gain stage. Emitter resistors 43 and 44 together with clamping transistors 45 and 75 provide current limiting for the output stage. When the current through one of these resistors is sufficient to turn on the base to emitter diode of the respective transistor, that transistor saturates and clamps the base of the respective output transistor 34 or 35, thus limiting the current. Capacitor 143, series capacitor 47, and resistor 48 provide the high frequency compensation for this final stage. Bias resistor 145 is connected between the base of transistor 35 and a source of negative voltage.

The power supply lines for the output stage are decoupled by networks consisting of resistors 131, 133 and capacitors 139, 141 to suppress high frequency transients.

Fuses 135 and 137 are inserted in the main power lines to prevent failure of the output stage under abnormal conditions.

The power lines are completely decoupled and filtered to prevent high frequency transients from affecting the amplifier. Capacitors 107 (FIG. 2), 125, 127 and 147 together with resistor 123 and Zener diode 117 (FIG. 2), accomplish the decoupling and filtering for the input and intermediate amplifiers.

As will be understood by one skilled in the art, a modulated-carrier-type amplifier is employed in a cascade relation with the main DC amplifier, not only to provide freedom from drift but also to provide increased forward gain at low frequencies. Such a stabilizing or balancing amplifier is illustrated in FIG. 4. In order to supply an input signal to the stabilizing amplifier, summing junction 10 of FIG. 1 is coupled by way of a low pass filter comprised of resistor 50, capacitor 51, resistor 52 and capacitor 203, to the gate of junction field effect transistor 53. Diodes 54 and 55 are coupled in oppositely poled arrangement to ground and act as clamping diodes to prevent accumulation of any charge on capacitor 51 during overload conditions.

The stabilizing amplifier constitutes a standard half-wave modulating circuit, the modulating element of which is junction field effect transistor 56, FIG. 5. The use of junction field effect transistor 56 eliminates the voltage offset problem present with a bipolar chopper transistor.

Field effect transistor 53 is connected as the input to the stabilizing amplifier. Blocking capacitor 203, at the input thereto, blocks extraneous currents in the conventional manner. The drain of transistor 53 is supplied from a low voltage source coupled through Zener diode 60 and from ground through resistor 62. Bias resistor 204 couples the gate of transistor 53 to ground. Capacitor 59 connected between the gate of transistor 53 (via capacitor 203) and ground acts to suppress high frequency switching transients. The signal at the source of field effect transistor 53 is direct coupled to the base of transistor 61 which is connected in a differential configuration along with transistor 63 to comprise the first voltage gain stage of the stabilizing amplifier. Capacitor 64 is connected between the collector and base of transistor 61 to provide negative feedback and high frequency stability for the first stage. Load resistors 176 and 178 couple the source of transistor 53 and the collector of transistor 61 to the negative voltage source as shown.

The amplified signal from the collector of transistor 61 is supplied by way of resistor 66 to the base of transistor 65 which comprises the second and final voltage gain stage of the stabilizing amplifier. Resistor 182 constitutes the bias resistor for transistor 65. Bias stability for the stabilizer is provided by a voltage divider formed of resistances 67 and 68 which are connected in a manner to provide negative feedback from the collector of transistor 65 to the base of transistor 63. Emitter resistor 221 couples the common emitter connection of transistors 61 and 63 to a source of positive voltage. The frequency dependent response of the stabilizing amplifier is determined by the characteristics of capacitor 76 and resistor 69 connected between the base of transistor 63 and ground and resistances 67 and 68, bias resistance 68 being coupled between the base of transistor 63 and a positive voltage source.

The collector of transistor 65 is coupled to a source of negative voltage through collector load resistor 180 and, through resistor 77 and capacitor 78, to the emitter of transistor 79, FIG. 5, which serves as the demodulator. The signal at this point constitutes the output of the stabilizing amplifier and is supplied to the base of transistor 82 of FIG. 2 by way of a low pass filter comprised of resistances 80, FIG. 4, and 83, FIG. 2, and capacitor 81. Transistor 82 of FIG. 2 is connected as an emitter follower and functions as an impedance converter to the base of transistor 22 which is the non-inverting input of the first voltage gain stage of the main direct coupled amplifier. Capacitor 84, in FIG. 2, between the base of transistor 82 and ground serves to reduce the high frequency noise of that stage.

Balance for the main amplifier is accomplished at the base of transistor 82 by way of resistors 85 and 86 together with an external potentiometer connected between a negative voltage source and ground (the arm of this potentiometer is connected to one side of resistance 86). This potentiometer (not shown) is adjusted such that the DC signal appearing at the output of the stabilizing amplifier is zero. This insures that the voltage at the summing junction is truly a minimum and hence the amplifier is balanced.

The solid state modulator and demodulator are driven from a self-contained oscillator eliminating the need for an external chopper drive signal. The oscillator, shown in FIG. 5, is composed of thyristors 88 and 90 together with their associated circuitry, i.e. resistors 92, 94, 96, 98, 100, 102, 104, and capacitor 106. This circuit is a conventional commutating astable square wave generator, the theory of operation of which is well known to those versed in the art. The frequency of operation of the square wave generator is approximately 83 Hz. This frequency constitutes a prime number equally removed from the power line frequency and its harmonics, and is purposely chosen so as to minimize intermodulation distortion arising from synchronous pickup.

Transistor 108 is driven by the anode gate circuitry of thyristor 88 and produces a symmetrical square wave at its collector with an excursion equal to the magnitude of the negative supply. This signal is coupled through resistor 110 to the base of the demodulator transistor 79. Capacitor 114 is connected from the base of transistor 79 to ground to suppress transient signals. The gate of the modulator field effect transistor 56 is driven from the collector of transistor 108 through a voltage divider circuit consisting of resistor 116, diode 118, and resistor 120. Resistor 120 is shunted to ground by capacitor 168. Diode 118 provides a high impedance to ground when transistor 79 is in its off state. This prevents high amplitude excursions at the emitter of transistor 79 from turning the demodulator ON. The signal at the anode gate of thyristor 88 is of opposite polarity to the signal driving the gate of field effect transistor 56. This signal is coupled to the drain of field effect transistor 56 through adjustable potentiometer 96, fixed resistor 124, and capacitor 122. By adjusting the setting of the variable tap on potentiometer 96, compensation for the switching transient produced by the gate-to-drain capacitance of field effect transistor 56 is obtained. The juncture of resistor 124 and capacitor 122 is grounded through capacitor 170: resistor 124 and capacitor 170 constituting a low pass filter.

The sense point or overload indication in the amplifier system is taken from the emitter of transistor 29 in FIG. 3, which constitutes the output of the second voltage gain stage. Under normal operating conditions, the quiescent voltage at this point is approximately one-half the value of the collector supply voltage for transistors 28 and 29. When an overload occurs, transistor 28 either cuts off or saturates depending upon the polarity of the overload, and the voltage at the emitter of transistor 29 is thus approximately the full supply voltage or zero respectively.

The error sensing circuitry, shown in FIG. 6, is composed of voltage dividers consisting of resistors 130 and 132, and resistors 134 and 136, together with transistors 138, 140, and 142. In normal operation, transistor 142 is in saturation, and transistors 138 and 140 are cut-off. Under this condition, transistor 141 is forward biased by a voltage divider circuit consisting of resistors 146, 148, and 158. The emitter of unijunction transistor 152 is therefore at a potential lower than the inter base voltage. Clamping transistors 154 and 156, of opposite polarity from transistor 141, are in cut-off. Resistors 200 and 201 couple the remaining elements of unijunction 152 to a positive power source and ground respectively. Resistor 150 is the collector load for transistor 142.

When overload occurs, either transistor 138 turns on, or transistor 142 turns off, turning on transistor 140 (depending upon the polarity of the overload). In either event, the potential at the junction of resistors 146 and 148 becomes approximately zero. Thus, transistor 141 is reversed biased by a voltage divider circuit consisting of resistors 158 and 148, and the voltage at the emitter of unijunction transistor 152 can charge through resistor 160 with a time constant dependant upon the values of resistor 160 and capacitor 162. Therefore, unijunction transistor 152 operates as a standard relaxation oscillator, and the output at its base is a train of positive pulses which may be used to activate a remote overload indicating circuit.

Transistors 154 and 156 are now turned on and their function is as follows: with transistor 156 in saturation, the gate field effect transistor 56 is at ground potential. Transistor 56 operates in the depletion region and is therefore turned on when its gate is at ground potential, thus preventing any accumulation of charge at the input to the stabilizer amplifier. With transistor 154 in saturation, the chopper drive circuitry is OFF forcing demodulator transistor 79, FIG. 5, to remain ON.

With no overload signal at the input to the stabilizer (i.e. transistor 56 turned ON) and the demodulator turned ON for the duration of the overload, no excess of charge can accumulate on frequency determining capacitor 76 in the stabilizer and on low pass filter capacitor 81. When the overload is removed, the overload sensing circuitry returns to its normal state in a very short time (in the microsecond range). As no accumulation in charge occurs in the stabilizer or in the stabilizer output filter, and with the absence of a blocking capacitor in the input to the main amplifier, recovery from overload is virtually immediate.

Now that the principles of the invention have been explained, it will be understood that modifications may be made without departing from the spirit of the invention. In some of these particular modifications, the bipolar transistors shown may be of the PNP type and the field effect transistors shown may be of the P type with corresponding reversal of polarities of the voltage sources.

Figure 4A:
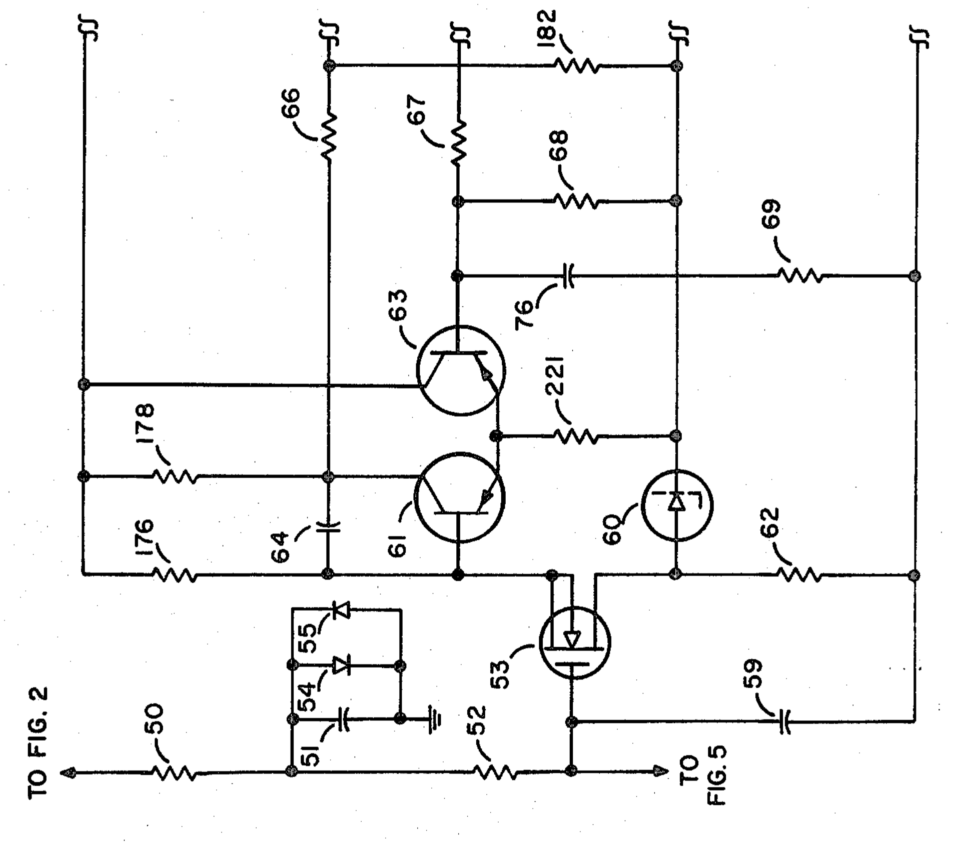

Further modifications of the invention are shown in FIGS. 4A and 5A in which like reference numerals denote like parts of FIGS. 4 and 5. FIG. 4A shows a modified stabilizer amplifier wherein an insulated gate field effect transistor 53′ has been substituted for junction field effect transistor 53. The advantages gained by this modification include the elimination of the need for blocking capacitor 203 and bias resistor 204. Since an insulated gate field effect transistor draws no gate current, the undesirable effects of the blocking capacitor discussed above are eliminated from this portion of the circuit as well. FIG. 5A shows a modified oscillator and chopper drive in which the modulator element 56′ is an insulated gate field effect transistor instead of the junction field effect transistor 56 shown in FIG. 5. The advantages again flow from the elimination of extraneous currents from this portion of the circuit. In addition, variable resistor 96 and fixed capacitor 122 may be replaced by fixed resistor 96′ and variable capacitor 122′.

FIG. 7 shows a modified input or first stage of amplification useable in the present invention. This stage employs two insulated gate field effect transistors 210 and 211 connected in a differential configuration. Current supply for transistors 210 and 211 is provided by a current source comprised of transistor 217 and resistors 218 – 220. Resistors 219 and 220, in practice of equal value, act as a voltage divider network at the base of transistor 217. The voltage drop across emitter resistor 218 determines the current supply. Capacitor 216 functions in a similar manner to capacitor 27, FIG. 2, by providing high frequency compensation for the stage. Feedback between the drain elements of transistors 210, 211 is provided via resistor 214 and capacitor 215. These elements, in conjunction with load resistors 212 and 213 determine the frequency response for the stage. In practice, this circuit may be substituted for the input or first amplifier stage shown in FIG. 2. Points A, B and C in FIG. 7 correspond to points A, B and C in FIG. 2 and represent the respective connection points for the circuit of FIG. 7 and the remainder of the amplifier system. The circuit of FIG. 7 would thus replace transistors 13, 20, 22 and 82; resistors 21, 105, 115 and 111; capacitors 25, 26 and 27; resistance 18 and diode 19.

In addition, field effect transistors 13 and 53 (or 53′) are not restricted to operate in the source follower configuration; they could as well be operated in the common source configuration.

It will now be apparent that different combinations of insulated gate field effect transistors and junction field effect transistors, utilized as disclosed herein, and within the scope of the invention.

I claim:

1. A stabilized direct coupled operational amplifier comprising:

a summing junction for receiving a signal to be amplified;

at least one stage of amplification for said signal having first and second inputs and an output;

an insulated gate field effect transistor having a gate element, a source element, and a drain element;

means connecting said gate element to said summing junction;

means connecting said source element to said amplifier first input;

a source of bias voltage;

means connecting said drain element to said voltage source;

a stabilizer amplifier having an input and an output, means connecting said summing junction to said stabilizer amplifier input for supplying any signal at said junction to said stabilizer amplifier;

a demodulator means connected to said stabilizer amplifier output and to said amplifier second input for demodulating the output of said stabilizing amplifier and applying said demodulated output to said stage;

an oscillator for producing a constant frequency output signal;

means connecting said oscillator output to said demodulator for operating said demodulator at said frequency;

modulator means connected to said stabilizer input and to said oscillator output for modulating said stabilizer input at said frequency;

overload detection means having an input connected to the output of said stage of amplification for producing an output signal upon the occurrence of an overload; and means connected to said overload detection means for applying said output signal to said oscillator and said modulator thereby and for disabling said oscillator and modulator to prevent current flow to said amplifier stage and said stabilizer amplifier.

* * * * *